United States Patent [19]

Katoh et al.

[11] Patent Number: 5,526,226
[45] Date of Patent: Jun. 11, 1996

[54] INFORMATION PROCESSING APPARATUS AND DEVICE ACCOMMODATED THEREIN WITH A MECHANISM FOR LOCKING A COVER

[75] Inventors: Katsutoshi Katoh, Tokyo-to; Michio Suzuki, Yokohama; Yoshiharu Uchiyama, Ischara; Kenshin Yonemochi, Kamakura, all of Japan

[73] Assignee: International Business Machines Corporation, Armonk, N.Y.

[21] Appl. No.: 279,121

[22] Filed: Jul. 22, 1994

[30] Foreign Application Priority Data

Jul. 23, 1993 [JP] Japan .................... 5-182971

[51] Int. Cl.⁶ .................... G06F 1/16; H05K 5/03; B65D 55/14
[52] U.S. Cl. .................... 361/680; 361/685; 361/726; 248/552; 70/159; 70/164
[58] Field of Search .................... 361/680, 683–685, 361/724–727; 360/137; 70/58, 158, 159, 163, 164, 166; 312/223.2, 222, 291; 364/708.1; 248/551–553

[56] References Cited

U.S. PATENT DOCUMENTS 5,154,456  10/1992  Moore et al. .................... 70/58 X
5,264,986  11/1993  Ohgami et al. .................... 361/685
5,446,618  8/1995  Tetsaya et al. .................... 70/58 X

*Primary Examiner*—Michael W. Phillips
*Attorney, Agent, or Firm*—Andrew J. Dillon

[57] ABSTRACT

An information processing apparatus is provided which includes a hard disk drive which is adapted to be accommodated within a main body of the information processing apparatus. The hard disk drive includes a movable member attached thereto. When the movable member slides into a first state, a portion of the movable member protrudes outside the main body of the information processing apparatus. A hinged keyboard is provided for covering the interior of the main body of the information processing apparatus and when the portion of the movable member protrudes outside the main body, the hinged keyboard is locked in a closed state. Additionally, a preventing latch is provided which may be utilized in conjunction with a card port in order to engage a PCMCIA card and prevent removal thereof. The preventing member is mounted under the keyboard such that when the keyboard is in a closed state, the PCMCIA card cannot be removed. In this manner, when the keyboard is closed and the movable member slides to the first state removal of hard disk drive assembly, or other subassemblies within the computer can be efficiently prevented.

5 Claims, 7 Drawing Sheets

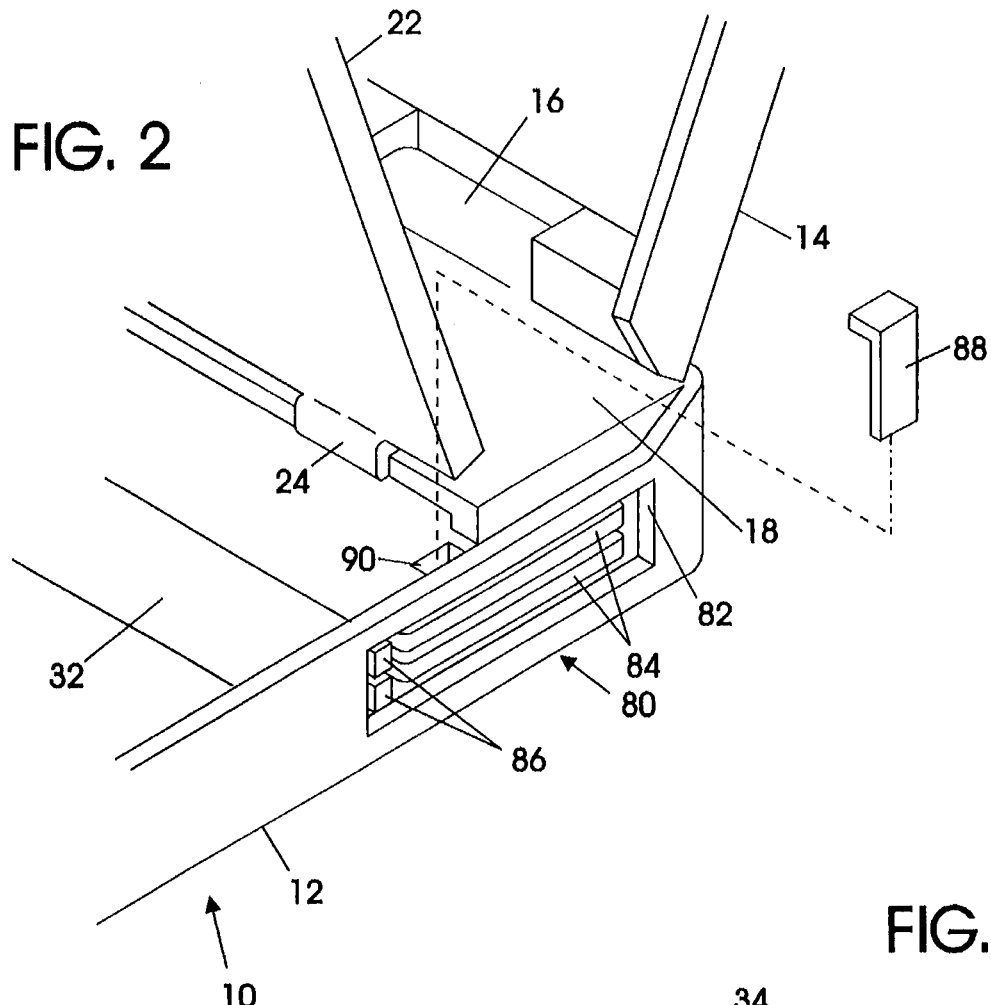
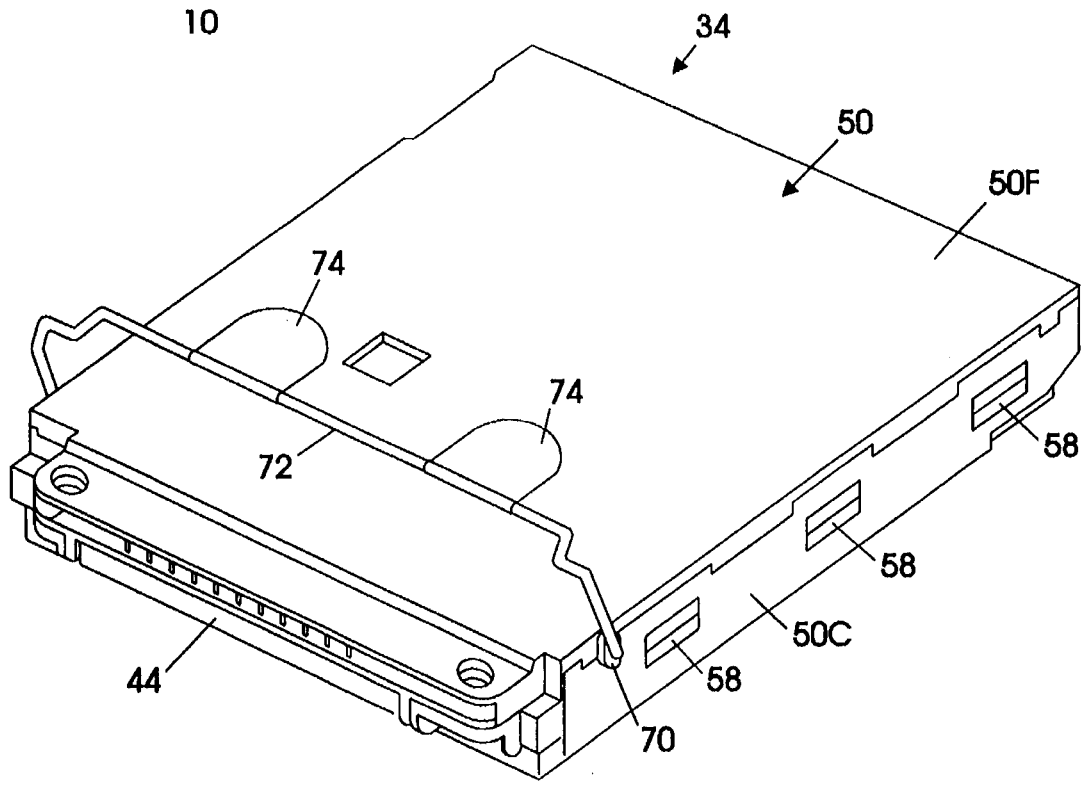

INFORMATION PROCESSING APPARATUS AND DEVICE ACCOMMODATED THEREIN WITH A MECHANISM FOR LOCKING A COVER

BACKGROUND OF THE INVENTION

1. Technical Field

The present invention primarily relates to a portable information processing apparatus, and particularly to an information processing apparatus constructed in which a device for processing information is accommodated within a main body of the information processing apparatus so as to be installable and removable, and a device accommodated therein.

2. Description of the Related Art

In an information processing apparatus, for example, a portable information processing apparatus, a construction is widely employed, in which a hard disk storage device (HDD), floppy-disk storage device (FDD), battery, or the like are each formed into a cartridge-shaped package and these packages are respectively accommodated in a main body of the processing apparatus so as to be installable and removable.

In this type of information processing apparatus, the aforementioned HDD package and the like can be installable to and removable from the information processing apparatus by a user. Accordingly, replacement of the HDD package with another HDD package in which different information is stored makes it possible for the information processing apparatus to achieve multi-functional features. Further, this type of information processing apparatus is effective for maintenance or the like.

On the other hand, these HDD packages, FDD packages, and the like are extremely expensive, and of course, in order to protect internal information, it is necessary to prevent unauthorized removal of these packages from a main body of the information processing apparatus.

In this case, if a security mechanism is provided for a plurality of devices (such as an HDD package, FDD package, and the like) which is accommodated within the main body of the information processing apparatus, for example, the security mechanism is independently provided for each device, and each security mechanism results in a complicated structure and an increase in cost. Further, the information processing apparatus, as a whole, must be increased in size due to the space necessary for accommodating each security mechanism therein. Accordingly, there has been eagerly desired for security with a simple structure for retaining a device such as the HDD package.

SUMMARY OF THE INVENTION

It is one object of the present invention to provide an information processing apparatus which can prevent unauthorized removal of a device for processing information (such as an HDD package), which is accommodated within a main body of the information processing apparatus, and can realize this feature with a simple structure and at a low cost.

It is another object of the present invention to provide a main body which is formed as a box-shape having an opening, and in which a device for processing information is accommodated so as to be installable and removable; a cover mounted to the main body so as to freely open and close the opening within the main body, the cover covering the device accommodated within the main body when the cover closes the opening; and a movable member mounted to the device, and when the device is accommodated within the main body, the movable member is movable between a state in which the movable member is exposed to the outside from the main body and a state in which the movable member is withdrawn into the main body, and in the state in which the movable member is exposed to the outside from the main body, the movable member engages with the closed cover so as to prevent the cover from opening.

Thus, the device accommodated within the main body is reliably covered with the cover maintained in a closed state, so that the removal of the device from the outside is prevented. Accordingly, if an externally exposed portion of the movable member which maintains the cover in a closed state is locked by an appropriate chain, key, or the like, movement of the movable member, i.e., opening of the cover, is reliably prevented, thereby making it possible to prevent unauthorized removal of the device accommodated within the main body.

Further, even when a plurality of devices are accommodated within the main body, it is possible to prevent opening of the cover, i.e., unauthorized removal of each device from main body, by providing the movable member in a single device. The foregoing can also be realized with a simple structure and at a low cost.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 2 is a perspective view illustrating a configuration of a preventing member and peripheral parts of the personal computer according to the embodiment of the present invention;

FIG. 4 is a perspective view illustrating the HDD pack, which is formed into a unitized body, of the personal computer according to the present embodiment;

DETAILED DESCRIPTION OF PREFERRED EMBODIMENT

Figure 1:
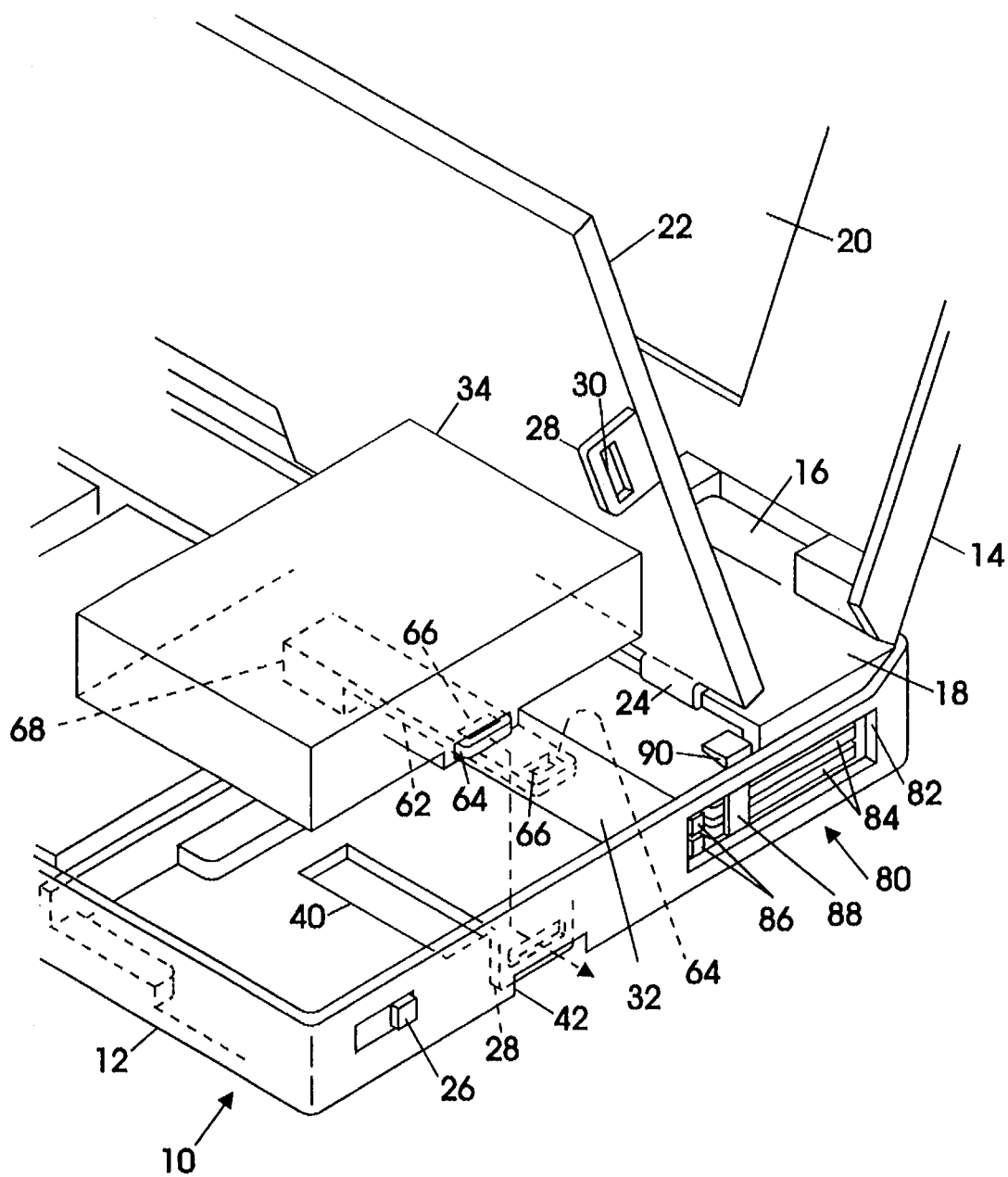
FIG. 1 is a perspective view illustrating a configuration of an HDD pack and peripheral parts of a personal computer according to an embodiment of the present invention.

With reference now to the figures and in particular with reference to FIG. 1, personal computer 10 is provided with a small-thickness (shallow) box-shaped main body 12 having an opening at an upper portion thereof, and a cover 14 provided so as to open and close with respect to main body 12. Cover 14 is formed into a small-thickness (shallow) box in the same way as main body 12 and provided with a pair of cylindrical projections 16 integrally formed in a lower end portion of cover 14. The pair of projections 16 is supported on an innermost end portion of a supporting plate 18 which is provided in an innermost end portion of main body 12 so as to have a predetermined width dimension. Accordingly, cover 14 can rotate around the pair of projections 16 so as to freely open and close main body 12. Further, a display panel 20 is disposed in the center of an opened side, namely, a back side, of cover 14.

Figure 6:
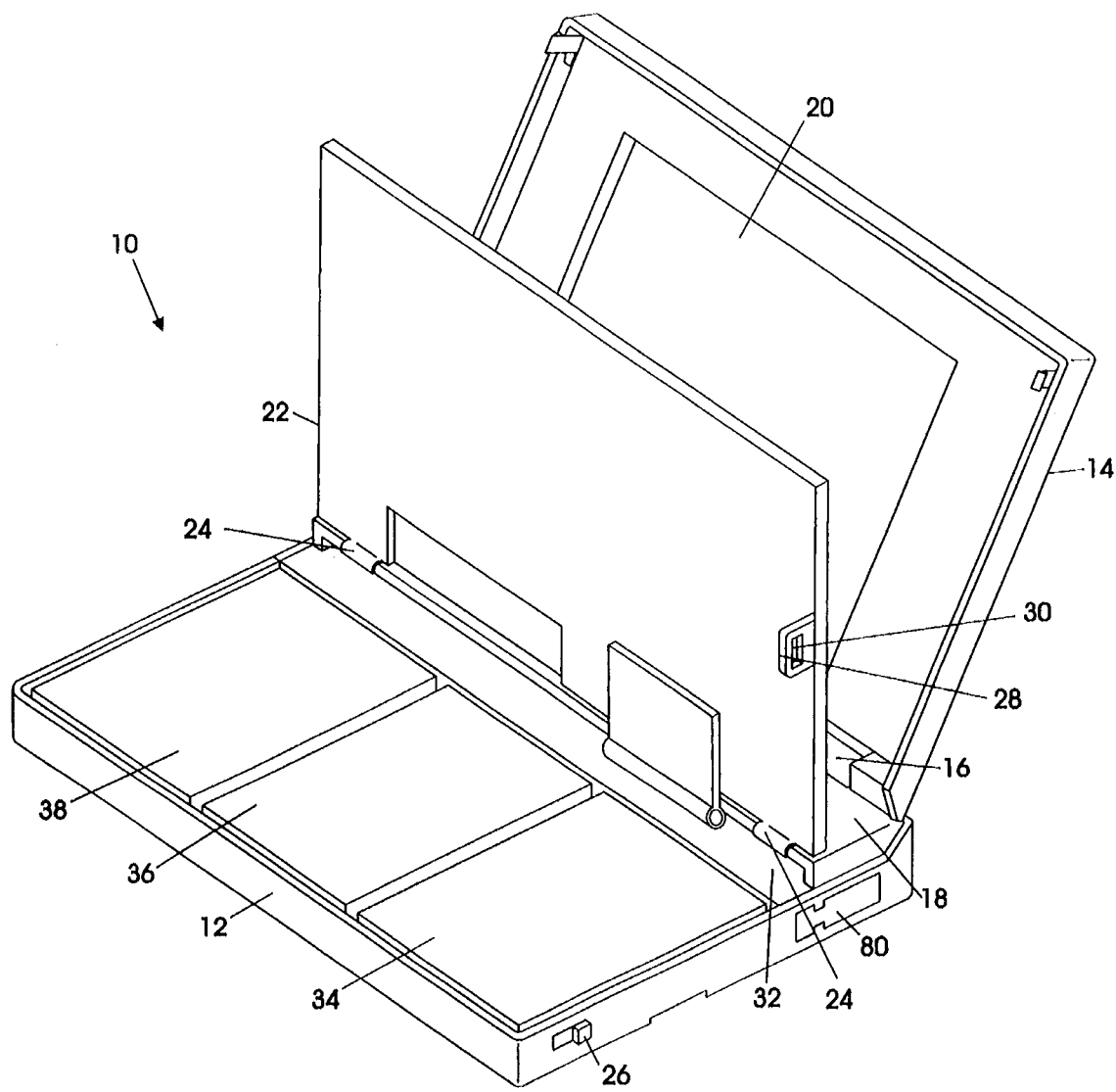
FIG. 6 is a perspective view illustrating a state in which a keyboard of the personal computer according to the present embodiment is opened.

Meanwhile, a keyboard 22, serving as a cover, is mounted at an end portion, which is near an operator (i.e., which is on the side opposite to the innermost end portion of supporting plate 18), of supporting plate 18 of main body 12. Referring now to FIG. 6 which is a perspective view illustrating a state in which keyboard 22 is opened and FIGS. 1 and 2 which are perspective views, illustrating details of principal portions of personal computer 10.

A pair of protrusions 24, each being formed into a ligule shape, is integrally formed in an innermost end portion of keyboard 22, such that the pair of protrusions 24 is supported on supporting plate 18 at an end portion thereof which is near an operator. Accordingly, keyboard 22 can rotate around the pair of protrusions 24 so that an upper-side opening portion of main body 12 may be freely opened and closed. In a state in which keyboard 22 closes the upper-side opening portion of main body 12, keyboard 22 shields an internal portion of main body 12 with the inside of main body 12 being in a covered state.

It should be noted that the aforementioned opening/closing operation of cover 14 with respect to main body 12 and the opening/closing operation of keyboard 22 with respect to main body 12 are respectively effected by operating an opening/closing operating latch 26 (two-stage operation) provided at a lateral-side portion of main body 12 (see FIGS. 1 and 6).

An engaging-protruding member 28 is integrally formed at an end portion of the back side of keyboard 22 so as to project toward a bottom wall of main body 12. An engaging hole 30 is formed in engaging-protruding member 28 so as to be engageable with a movable member 62 which will be described later.

Further, a partition wall 32, which is formed utilizing a thin-walled metal plate which is bent into a predetermined shape, is disposed on an inner side within main body 12.

Inside partition wall 32, an unillustrated system main board (such as a microprocessor) is disposed. An unillustrated connector for an HDD pack, terminal for a battery pack, connector for an FDD pack, and the like are also disposed in an end portion of partition wall 32 on the side thereof near an operator.

Meanwhile, an HDD pack 34, a battery pack 36, and an FDD pack 38, each referred to herein as a device for processing information, are respectively installed within main body 12 at side thereof near the operator. HDD pack 34, battery pack 36, and FDD pack 38 are respectively adapted so as to be freely installable in and removable from main body 12. In a state in which these packs are installed within main body 12, these packs are respectively connected to each of the aforementioned unillustrated connectors and terminals disposed within main body 12.

Figure 5:
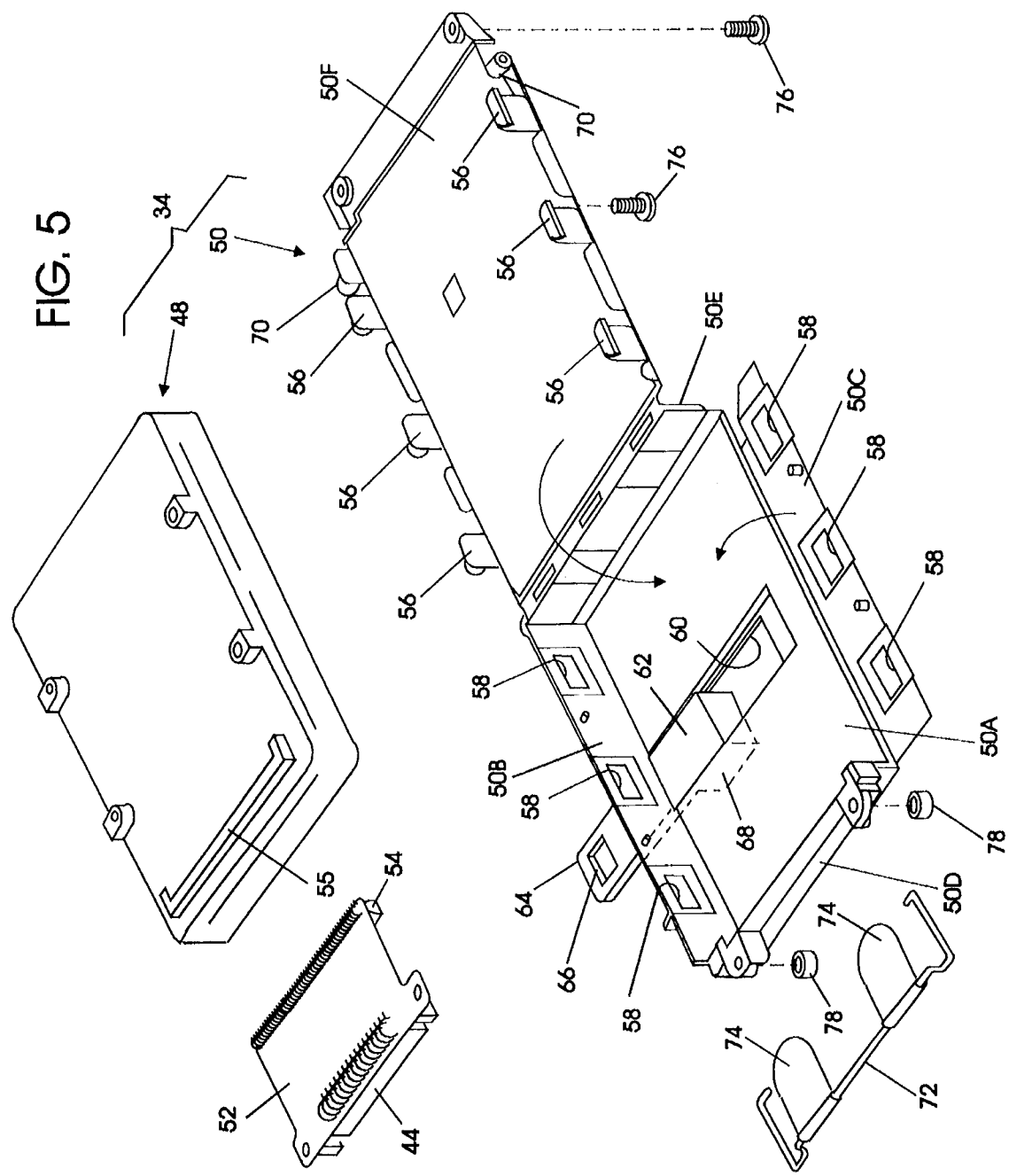
FIG. 5 illustrates an exploded perspective view of the HDD pack as shown in FIG. 4.

Next, a construction of HDD pack 34 will be described. As illustrated in FIGS. 4 and 5, HDD pack 34 is provided with an HDD main body 48 and an accommodating case 50. A flexible substrate 52 is mounted to HDD main body 48. Flexible substrate 52 is formed into a rectangular flat plate made from resin material. A connector 54 for HDD main body is mounted to one of end portions of flexible substrate 52, and a connector 44 for system main body is mounted to the other end portion thereof.

Then, connector 54 for HDD main body is connected to connector 55 disposed on a front-end top surface of HDD main body 48. On the other hand, accommodating case 50, which is formed into a predetermined shape from resin material, is comprised of a bottom wall 50A, a pair of side walls 50B, 50C, a front-end wall 50D, a rear-end wall 50E, and a top wall 50F. It should be noted that one side wall 50B, front-end wall 50D, and rear-end wall 50E do not rotate with respect to bottom wall 50A, and another side wall 50C and top wall 50F is rotatable with respect to bottom wall 50A by means of resin hinge. Further, a plurality of pawls 56 extending in a vertical direction is formed at both end portions of top wall 50F. A plurality of rectangular openings 58 corresponding to plurality of pawls 56 is formed on the pair of side walls 50B, 50C.

Further, a claw (a reference numeral is omitted) is respectively formed at front and rear ends of the side wall 50C and each end portion of the front-end wall 50D and rear-end wall 50E such that these claws can engage with each other.

Further, a rectangular slide hole 60 is formed on bottom wall 50A along a transverse direction of bottom wall 50A, and a movable member 62 is slidably disposed in slide hole 60. Movable member 62 is adapted such that a leading-end engaging portion 64 thereof can protrude outside side wall 50B, and when movable member 62 slides along slide hole 60, the leadings-end engaging portion 64 can be engaged with the aforementioned engaging hole 30 formed in the engaging-protruding member 28 of keyboard 22. In addition, a locking hole 66 is formed in the leading-end engaging portion 64 of movable member 62. Further, an operating-protruding portion 68 is formed at a back side of movable member 62 so as to protrude outside from bottom wall 50A (slide hole 60).

The operating-protruding portion 68 is used for an operation of movable member 62. Further, a pair of supporting projections 70 each having a small hole in a shaft center portion thereof is coaxially formed at both sides of the front-end portion of top wall 50F of accommodating case 50. A wire 72 is engaged with these supporting projections 70. Moreover, a pair of tapes 74 is bonded to wire 72.

HDD pack 34 having the aforementioned structure can be unitized such that HDD main body 48 is accommodated within accommodating case 50 in the following manner. First, HDD main body 48 is mounted on bottom wall 50A of accommodating case 50. It should be noted that, at this time, connector 54, for HDD main body, of flexible substrate 52 is first connected to connector 55 of HDD main body 48. Further, when HDD main body 48 is mounted on bottom wall 50A, flexible substrate 52 is bent at an intermediate portion thereof at an angle of 180° so as to be closely overlapped, and at the same time, is further bent at an angle of 90° in the vicinity of connector 44 for system main body. As a result, connector 54 for HDD main body faces the side of rear-end wall 50E, while connector 44 for the system main body faces the side of bottom wall 50A (these connectors cross each other at right angles). Next, another side wall 50C is bent so as to be engaged with front-end wall 50D and rear-end wall 50E before top wall 50F is bent so as to cause pawls 56 to engage with openings 58. After that, top wall 50F is screwed to front-end wall 50D in a state in which two positions on flexible substrate 52, which are located on both sides of connector 44 for the system main body, are fastened by screws 76 and nuts 78. And finally, both end portions of wire 72 are elastically deformed, and at the same time, are engaged with the supporting projections 70 of side walls 50B, 50C. Accordingly, HDD pack 34 is constructed in that the HDD main body 48 which is protected by accommodating case 50 comprised of a single resin material (see FIG. 4).

An HDD pack 34 having the aforementioned structure is, together with the battery pack 36 and the FDD pack 38, installed within main body 12 as described above.

However, in this case, installation of HDD pack 34 is effected in a state in which movable member 62 is positioned completely under HDD pack 34, as illustrated in FIG. 1. Here, a penetration hole 40 corresponding to movable member 62 is formed on bottom wall of main body 12, and in the state in which HDD pack 34 is installed within main body 12, operating-protruding portion 68 of movable member 62 can be operated from the outside of main body 12 (bottom wall). Further, in the state in which HDD pack 34 is installed within main body 12, leading-end engaging portion 64 of movable member 62 corresponds to a penetration hole 42 formed on a side wall of main body 12, and when movable member 62 slides along slide hole 60, leading-end engaging portion 64 of movable member 62 protrudes outside side wall (penetration hole 42) of main body 12. In addition, leading-end engaging portion 64 of movable member 62 with HDD pack 34 being in an installed state corresponds to the aforementioned engaging-protruding member 28 (engaging hole 30) of keyboard 22. Thus, leading-end engaging portion 64 is constructed so as to be inserted into the engaging hole 30 of engaging-protruding member 28 when movable member 62 slides along slide hole 60 with keyboard 22 being in a closed state.

Meanwhile, a card-inserting portion 80 comprised of upper and lower sections is provided in an inner side of a portion of main body 12, where HDD pack 34 is accommodated, (i.e., inside partition wall 32), and a PCMCIA card (a card having a connecting feature with respect to a modem and external equipment and other various features) 84, referred to herein as a device for processing information, can be inserted into the card-inserting portion 80 from a lateral side of main body 12 (at insertion opening 82). Card-inserting portion 80 of upper and lower sections are provided with eject buttons 86, which are respectively used for cards in the upper and lower sections. The operation of eject button 86 allows PCMCIA card 84 within card-inserting portion 80 to be removed.

Further, as illustrated in FIG. 2, a preventing member 88 is provided at card-inserting portion 80 so as to be installable and removable. Preventing member 88, which is formed into a substantially L-shaped configuration, can be mounted from a mounting hole 90 corresponding to card-inserting portion 80. Mounting hole 90 is provided in a peripheral portion of an upper-side opening of main body 12. In a state in which preventing member 88 is inserted from and mounted to mounting hole 90, preventing member 88 is positioned at insertion opening 82 of card-inserting portion 80 and engages with PCMCIA card 84 within card-inserting portion 80 so as to prevent PCMCIA card 84 from being removed. In addition, preventing member 88 and mounting hole 90 are disposed beneath an end portion of keyboard 22 in a closed state. Accordingly, when keyboard 22 is closed in the state in which preventing member 88 is mounted to mounting hole 90, preventing member 88 is covered with keyboard 22 so as to not be removed from the outside.

Next, an operation of the present embodiment will be described hereinafter on the assumption that an HDD pack 34, FDD pack 38, and the like, which are adapted so as to be installable and removable, are installed within a main body of a personal computer.

Figure 7:
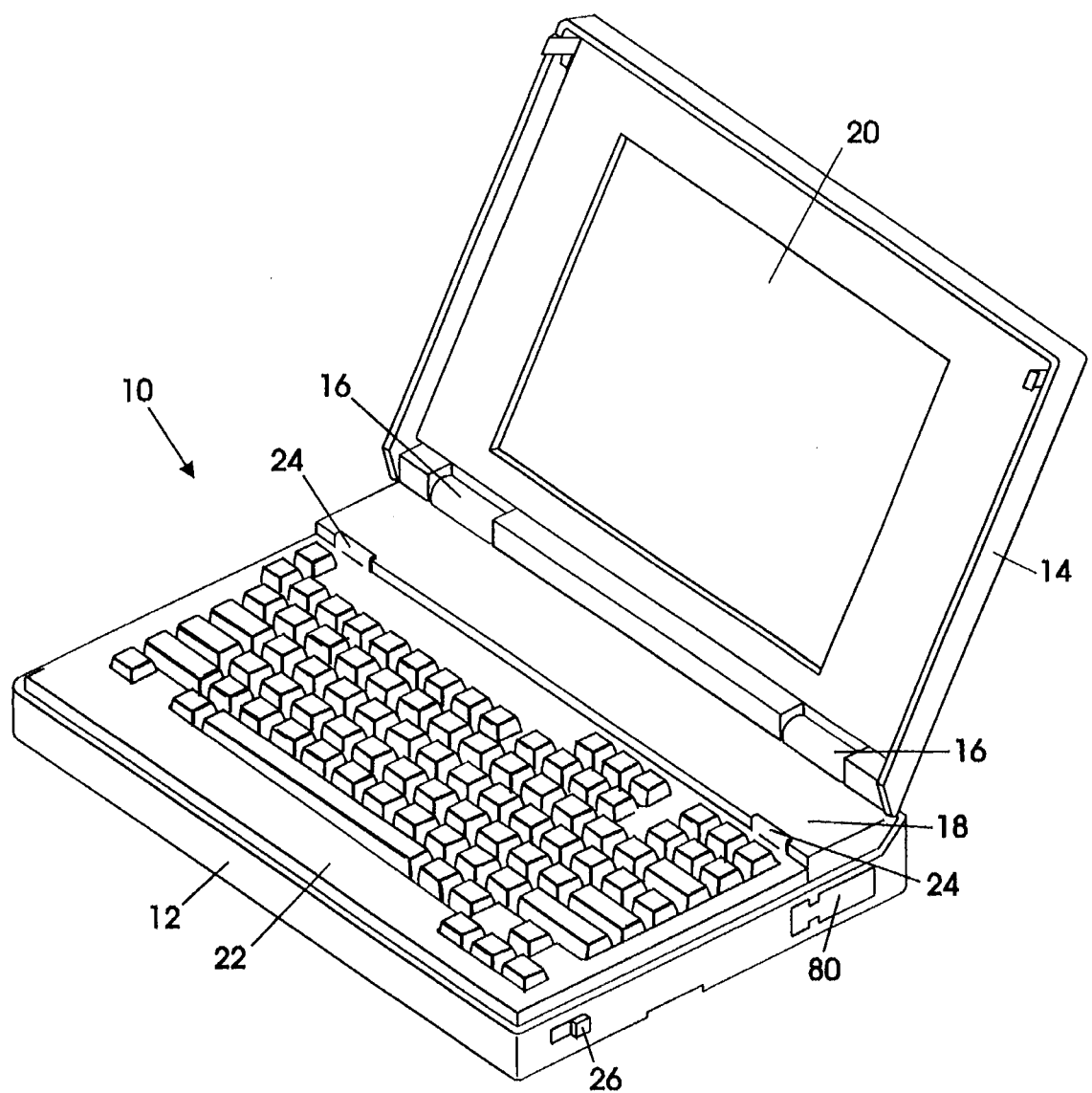
FIG. 7 is a perspective view illustrating a state in which the personal computer is being used according to the present embodiment, where the keyboard is closed.
Figure 8:
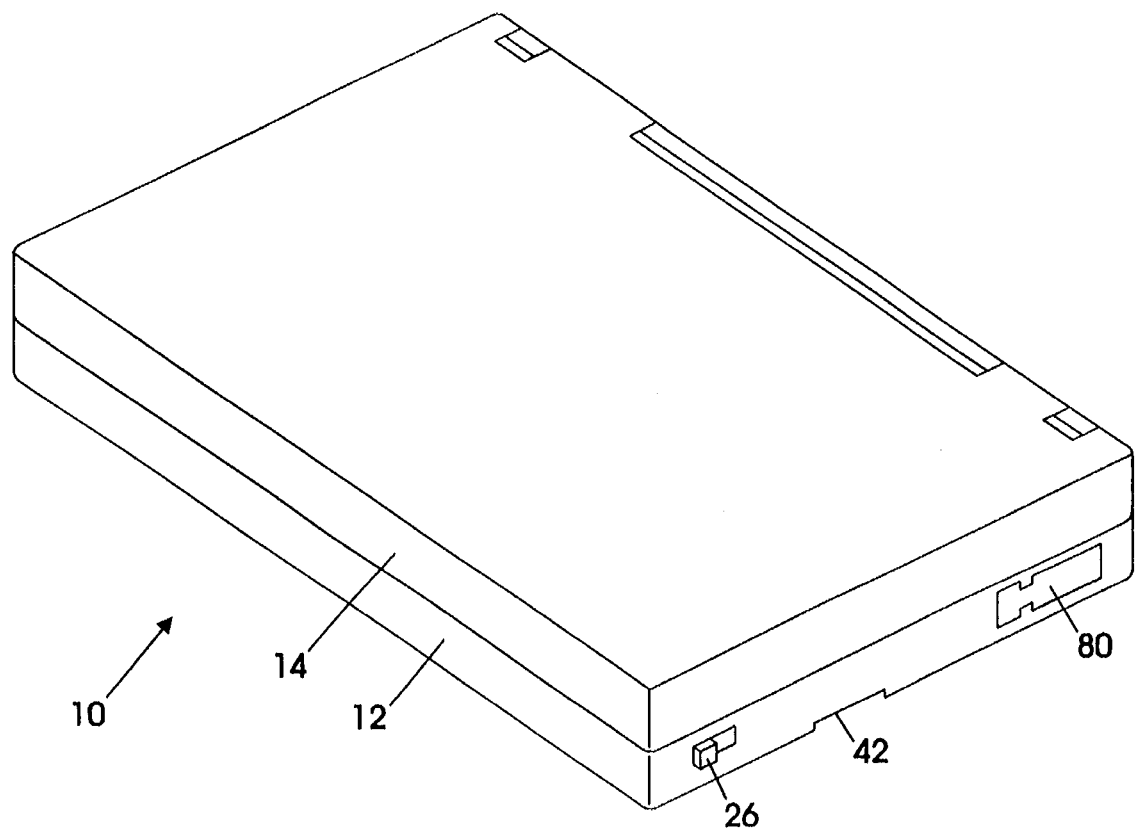
FIG. 8 is a perspective view illustrating a state in which the personal computer is used according to the present embodiment, where the cover thereof is closed.

In a personal computer 10 in which a cover 14 is closed so that computer is brought into a state of being not used, as shown in FIG. 8, an opening/closing operating latch 26 is first operated by one step. As a result, a main body 12 and a cover 14 of personal computer 10 being in an unused state are released from being engaged with each other. Next, cover 14 is rotated around pair of projections 16 in a direction of moving away from main body 12 so that cover 14 is brought into a state of being opened (see FIG. 7). Secondly, opening/closing operating latch 26 is operated by two steps. As a result, main body 12 and keyboard 22 are released from being engaged with each other. Next, keyboard 22 is rotated around the pair of protrusions 24 in a direction of moving away from main body 12 so as to cause keyboard 22 to be brought into a state of being opened. As a result, personal computer 10 is brought into a state as illustrated in FIG. 6 and the inside of main body 12 is revealed.

Subsequently, HDD pack 34, FDD pack 38, and the like are accommodated within main body 12 from an upper-side opening of main body 12. Further, keyboard 22 may be rotated around the pair of protrusions 24 in a direction of main body 12 so that keyboard 22 is brought into a closed state. As a result, personal computer 10 is brought into a state as illustrated in FIG. 7, so that HDD pack 34, FDD pack 38, and the like accommodated within main body 12 are covered with keyboard 22. On the other hand, when PCMCIA card 84 is used, PCMCIA card 84 is inserted from a lateral side (the insertion opening 82) of main body 12 and is accommodated in card-inserting portion 80.

In this manner, when PCMCIA card 84 is accommodated in card-inserting portion 80, preventing member 88 may be inserted from mounting hole 90 and then mounted to main body 12 before keyboard 22 is brought into a closed state as illustrated in FIG. 2. As a result, preventing member 88 is positioned at insertion opening 82 of card-inserting portion 80. Therefore, preventing member 88 engages with PCMCIA card 84 within card-inserting portion 80 so that ejection of PCMCIA card 84 is prevented irrespective of the operation of the eject button 86. Further, when keyboard 22 is closed in the state in which preventing member 88 is mounted to the main body 12, preventing member 88 is covered with keyboard 22 and the operation of preventing member 88 from outside (i.e., removal of preventing member 88) is prevented.

Figure 3:
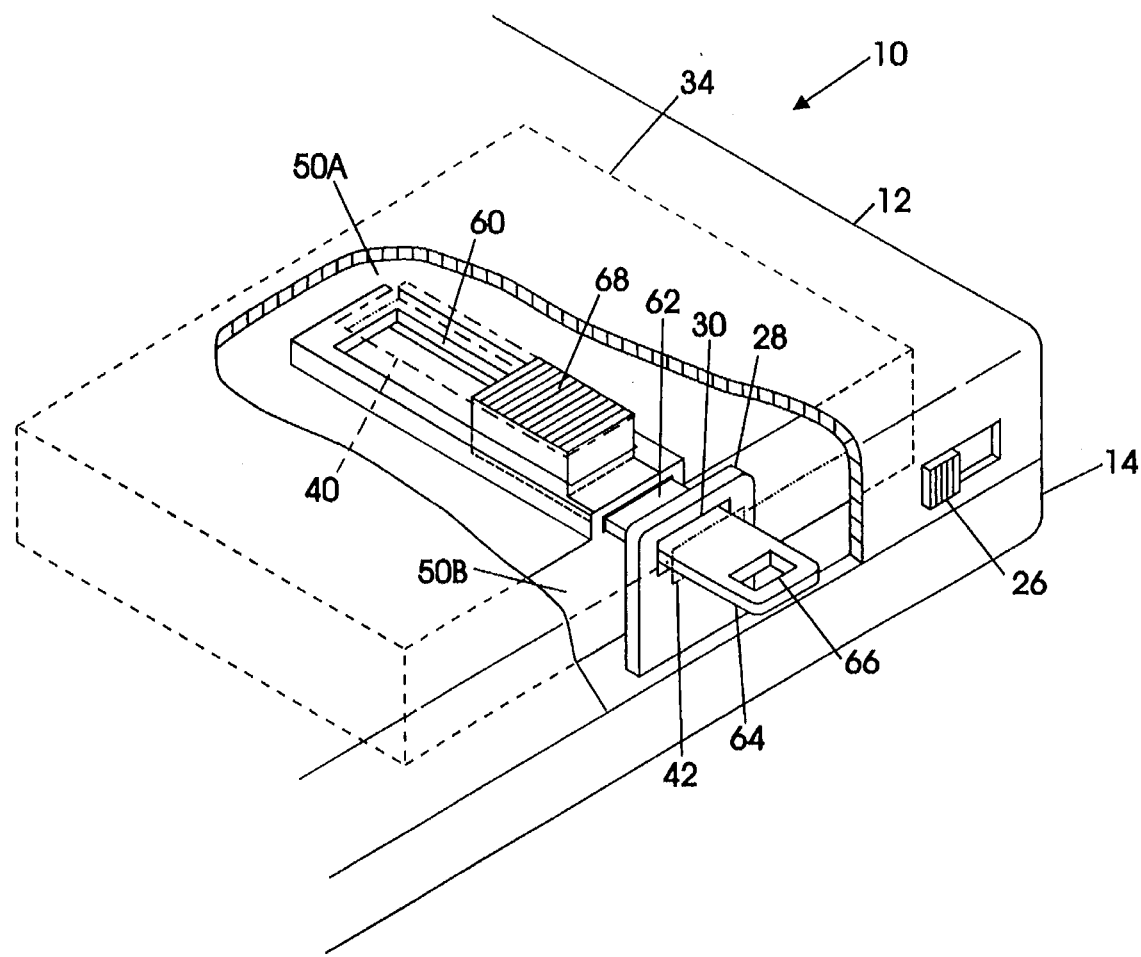
FIG. 3 is a partially-broken perspective view seen from a back side of the personal computer according to the present embodiment, illustrating a state in which an engaging-protruding member of a keyboard is engaged with and stopped by a movable member of the personal computer.

In addition, in the state in which keyboard 22 is closed, when operating-protruding portion 68 of movable member 62 provided in HDD pack 34 is operated so as to cause movable member 62 to slide along slide hole 60, leading-end engaging portion 64 is inserted into engaging hole 30 of the engaging-protruding member 28 of keyboard 22, as illustrated in FIG. 3, and at the same time, a locking hole 66 is revealed outside main body 12. As a result, opening of keyboard 22 is prevented.

In other words, devices accommodated within main body 12, such as HDD pack 34 and FDD pack 38, and preventing member 88 until it is mounted to main body 12 are reliably covered with keyboard 22 which is maintained in a closed state by movable member 62 so that removal thereof from the outside is prevented. Accordingly, if locking hole 66 (externally exposed portion) of leading-end engaging portion 64 of movable member 62 which maintains keyboard 22 in a closed state is locked by an appropriate chain, key or the like, movement of movable member 62, i.e., opening of keyboard 22, and removal of preventing member 88 are reliably prevented, thereby making it possible to prevent not only the removal of HDD pack 34 and FDD pack 38 which are accommodated within main body 12 but also the removal of PCMCIA card 84 which is accommodated in card-inserting portion 80.

Thus, in personal computer 10 according to the present embodiment, since opening of keyboard 22 is restricted by movable member 62 provided at HDD pack 34, it is possible to prevent unauthorized removal of a device, e.g., HDD pack 34 or FDD pack 38, which is accommodated within main body 12, with a simple structure and at a low cost. Further, even when a plurality of devices such as an HDD pack 34 and the like is accommodated within main body 12, it is possible to prevent each device from being removed from main body 12 without authorization only by providing a single movable member 62. Further, by selectively using preventing member 88, it is possible to prevent unauthorized removal, from main body 12, of PCMCIA card 84 which is inserted from the lateral side (insertion opening 82) of main body 12 and accommodated in card-inserting portion 80.

Although, the present embodiment is constructed such that movable member 62 is provided in HDD pack 34, the present invention is not limited to this embodiment, and movable member 62 may be provided at FDD pack 38 or battery pack 36. In this case as well, opening movement of keyboard 22 can be restricted, thereby preventing a device which is accommodated within main body 12 or PCMCIA card 84 which is accommodated in the card-inserting portion 80 from being removed without authorization.

Further, in the present embodiment, a notebook-typed personal computer 10 serving as an information processing apparatus is given as an example. However, the present invention is not limited to the same, and may be applied to a desktop personal computer and further can be applied to various information processing apparatuses.

While the invention has been particularly shown and described with reference to a preferred embodiment, it will be understood by those skilled in the art that various changes in form and detail may be made therein without departing from the spirit and scope of the invention.

We claim:

1. An information processing apparatus comprising:

a main body which is formed as a box-shape having an opening, and in which a device for processing information is accommodated so as to be installable and removable therefrom;

a cover mounted to said main body so as to freely open and close said opening of said main body, said cover covering said device accommodated within said main body when said cover closes said opening; and a movable member mounted to said device such that when said device is accommodated within said main body, said movable member is movable between a first state in which a portion of said movable member is exposed outside of said main body and a second state in which said portion of said movable member is withdrawn into said main body, and in said first state in which said portion of said movable member is exposed outside of said main body, said movable member engaging with said closed cover so as to prevent said cover from opening.

2. The information processing apparatus according to claim 1, wherein said main body includes an aperture therein and wherein said movable member includes a protrusion adapted to be exposed within said aperture wherein said protrusion may be utilized to move said movable member between said first state and said second state.

3. The information processing apparatus according to claim 1, wherein said device comprises a hard disk drive device.

4. The information processing apparatus according to claim 1, wherein said portion of said movable member which is exposed outside of said main body within said first state includes a lock aperture for receiving a restraining device.

5. The information processing apparatus according to claim 1, wherein said cover includes a keyboard mounted thereto.

* * * * *